(12) United States Patent
Chen et al.

(10) Patent No.: US 10,290,638 B1
(45) Date of Patent: May 14, 2019

(54) METHOD OF FORMING DYNAMIC RANDOM ACCESS MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yi-Wei Chen, Taichung (TW); Tsun-Min Cheng, Changhua County (TW); Shih-Fang Tzou, Tainan (TW); Chih-Chieh Tsai, Kaohsiung (TW); Kai-Jiun Chang, Taoyuan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/964,089

(22) Filed: Apr. 27, 2018

(51) Int. Cl.
| | | |
|---|---|---|
| *H01L 27/108* | (2006.01) | |
| *H01L 23/532* | (2006.01) | |
| *H01L 21/285* | (2006.01) | |
| *H01L 21/768* | (2006.01) | |
| *H01L 23/528* | (2006.01) | |
| *H01L 21/02* | (2006.01) | |
| H01L 21/3105 | (2006.01) | |
| H01L 21/265 | (2006.01) | |
| H01L 29/10 | (2006.01) | |
| H01L 21/306 | (2006.01) | |

(52) U.S. Cl.
CPC .. *H01L 27/10876* (2013.01); *H01L 21/02068* (2013.01); *H01L 21/2855* (2013.01); *H01L 21/28525* (2013.01); *H01L 21/28568* (2013.01); *H01L 21/76846* (2013.01); *H01L 21/76877* (2013.01); *H01L 23/5283* (2013.01); *H01L 23/53271* (2013.01); *H01L 27/10885* (2013.01); *H01L 27/10888* (2013.01); *H01L 21/26513* (2013.01); *H01L 21/30625* (2013.01); *H01L 21/31053* (2013.01); *H01L 29/1083* (2013.01)

(58) Field of Classification Search
CPC ......... H01L 27/10876; H01L 21/02068; H01L 23/53271; H01L 21/76877; H01L 27/10888; H01L 21/28525; H01L 27/10885; H01L 23/5283; H01L 21/28568; H01L 21/76846
See application file for complete search history.

(56) References Cited

U.S. PATENT DOCUMENTS

| | | |
|---|---|---|
| 7,915,121 B1 | 3/2011 | Kim |
| 9,773,789 B1 | 9/2017 | Chen |

*Primary Examiner* — Anthony Ho
(74) *Attorney, Agent, or Firm* — Winston Hsu

(57) ABSTRACT

A method of forming dynamic random access memory (DRAM) device, comprises the following steps. First of all, a plurality of active areas is formed in a substrate along a first direction. Next, a plurality of buried gates disposed in the substrate is formed along a second trench extending along a second direction across the first direction. Then, a plurality of bit lines is formed over the buried gates and extended along a third direction across the first direction and the second direction, wherein each of the bit lines comprises a polysilicon layer, a barrier layer and a metal layer and the barrier layer is formed through a radio frequency physical vapor deposition (RF-PVD) process.

12 Claims, 9 Drawing Sheets

METHOD OF FORMING DYNAMIC RANDOM ACCESS MEMORY DEVICE

BACKGROUND OF THE INVENTION

1. Field of the Invention

The present invention relates to a method of forming a memory device, and more particularly, to a method of forming a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

The present invention therefore provides a method of forming a dynamic random access memory (DRAM) device, in which a barrier layer with a high-density and a less-thickness is formed in the bit lines through a single process, so as to reduce the resistance of the barrier layer under a simplified process flow.

To achieve the purpose described above, the present invention provides a method of forming a DRAM device including the following steps. First of all, a plurality of active areas is formed on a substrate along a first direction. Then, a plurality of buried gates is formed in the substrate, to extend along a second direction across the first direction. Finally, a plurality of bit lines is formed over the buried gates to extend along a third direction across the first direction and the second direction. Each of the bit lines includes a polysilicon layer, a barrier layer and a metal layer, wherein the barrier layer is formed through a radio frequency physical vapor deposition (RF-PVD) process.

The present invention provides a method of forming a DRAM device, by forming the barrier layer thereof via a RF-PVD process. Through this performance, the barrier layer is allowable to obtain a thinner thickness such as about 20-30 angstroms and a higher density such as 4.7-5.4 g/cm$^3$, so that, the barrier layer may therefore obtain a reduced resistance and a reduced height under a simplify process flow.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating a method of forming a dynamic random access memory (DRMA) device according to a preferred embodiment of the present invention, wherein:

FIG. 1 is a schematic top view of a DRAM device of the present invention;

FIG. 2 to FIG. 7 are schematic cross-sectional views of a DRAM device during the forming steps;

FIG. 8 is a schematic cross-sectional view of a DRAM device take along a cross line A-A' in FIG. 1; and FIG. 9 is a schematic cross-sectional view of a DRAM device take along a cross line B-B' in FIG. 1.

DETAILED DESCRIPTION

To provide a better understanding of the present invention, preferred embodiments will be described in detail. The preferred embodiments of the present invention are illustrated in the accompanying drawings with numbered elements.

Figure 1:
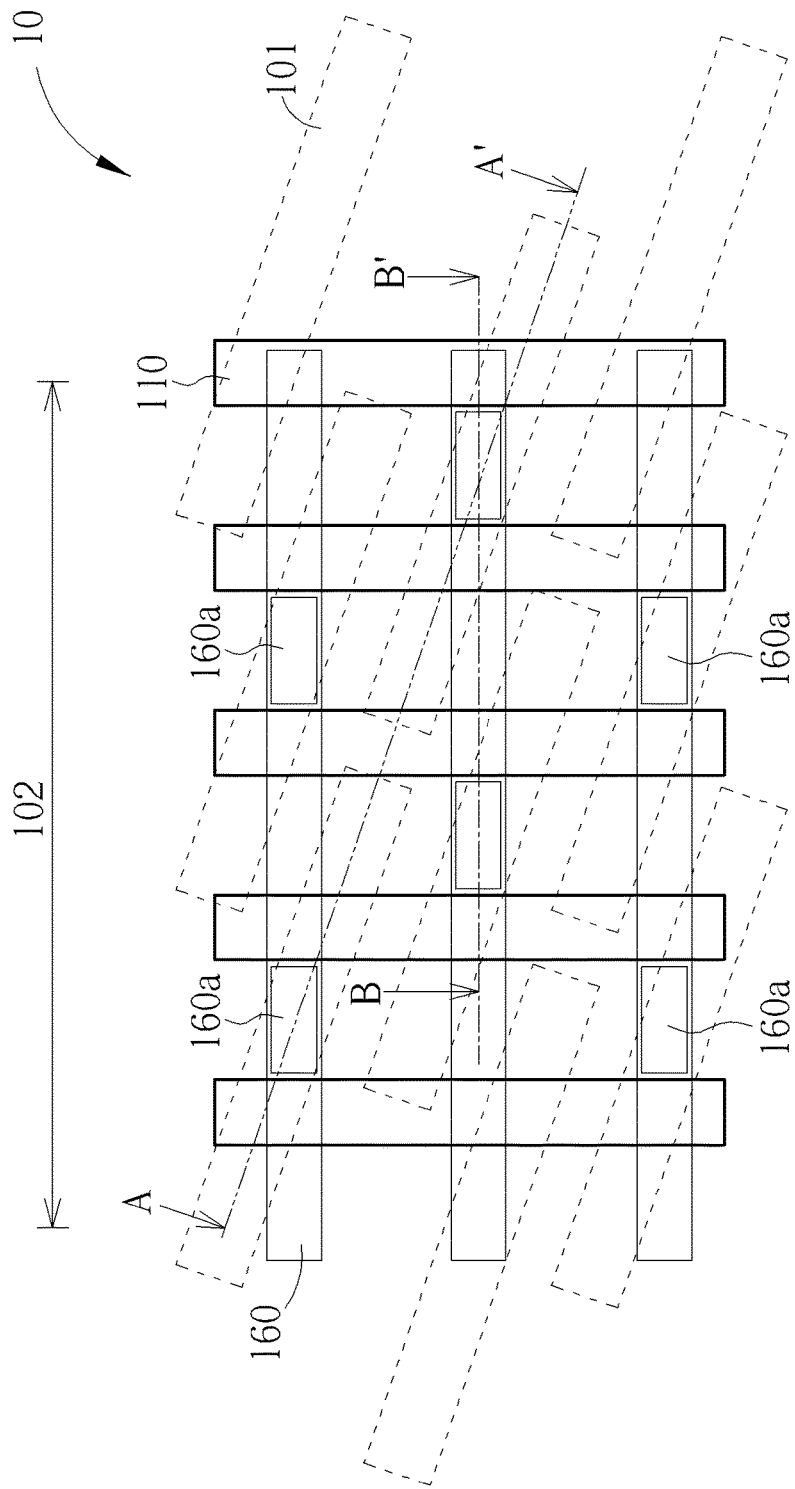
Figure 6:
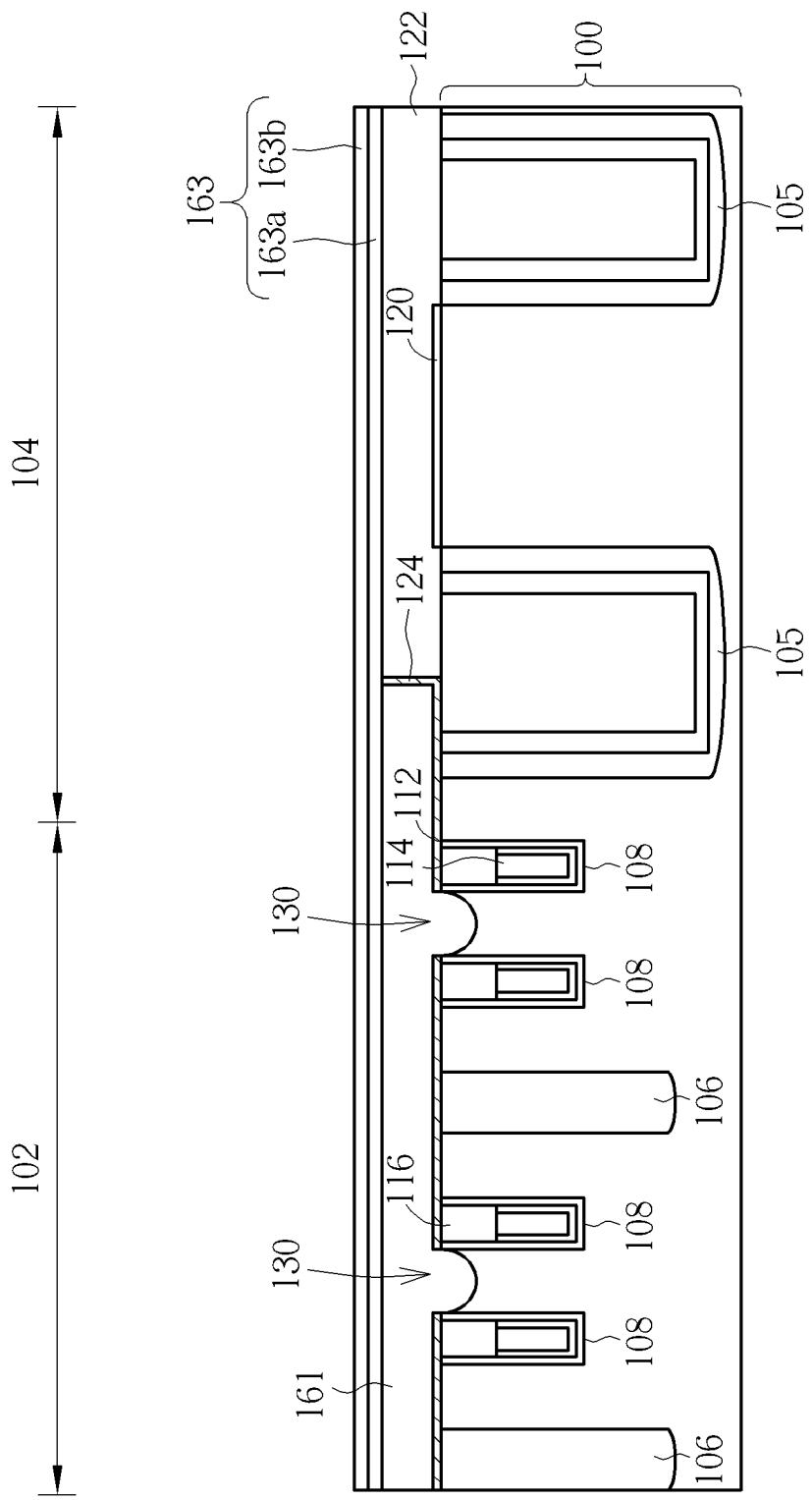
Figure 7:
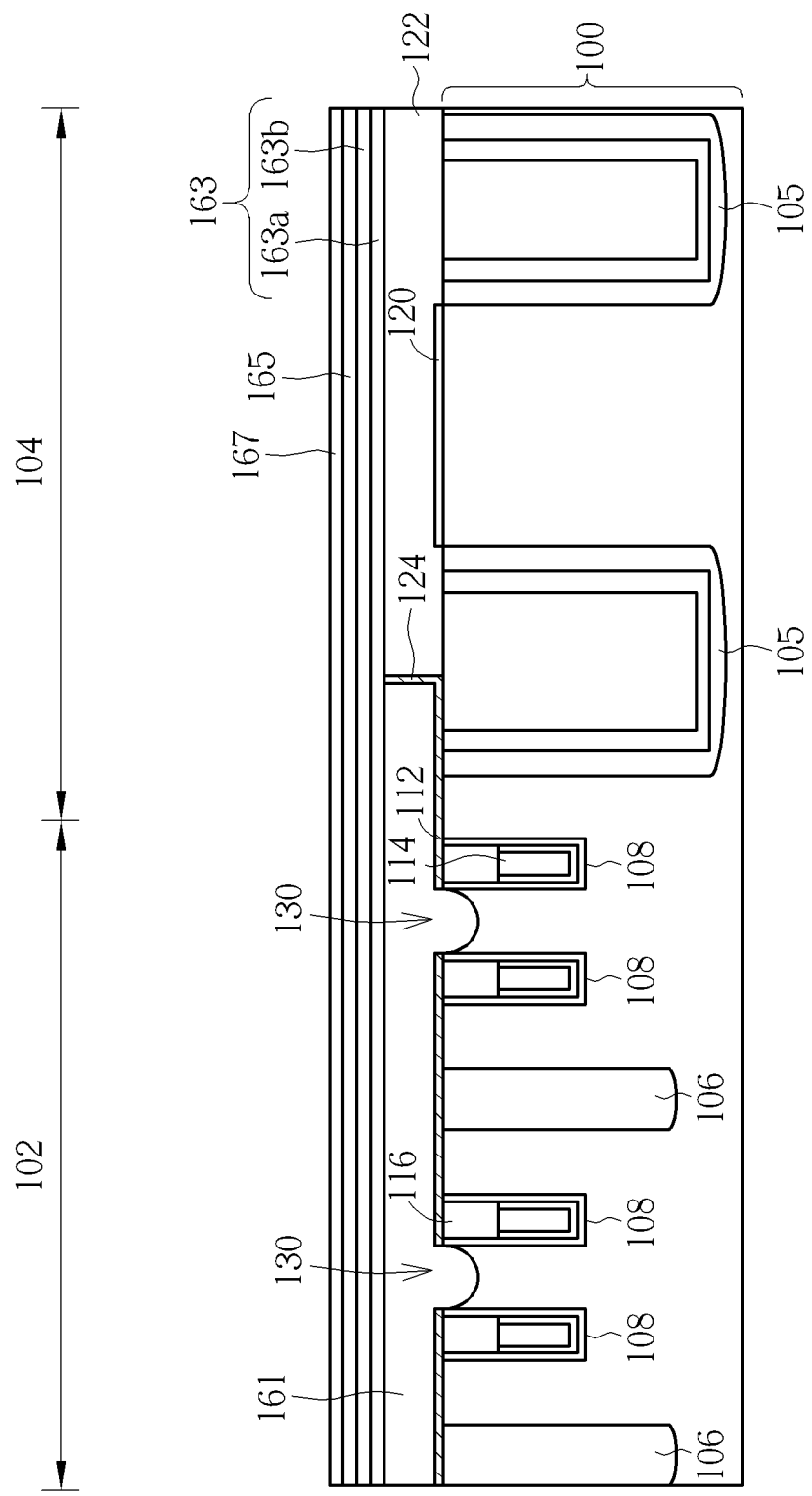
Figure 8:
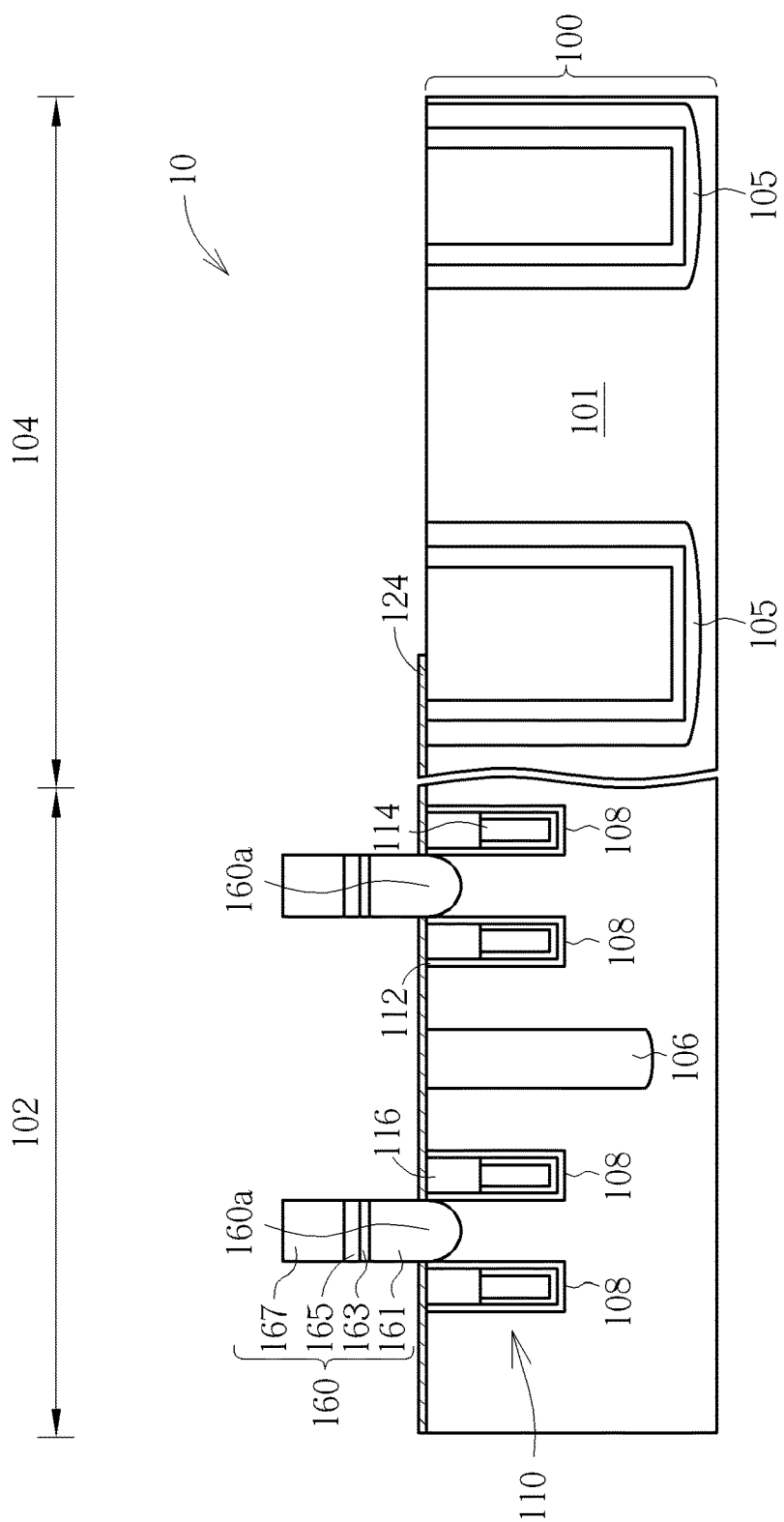
Figure 9:
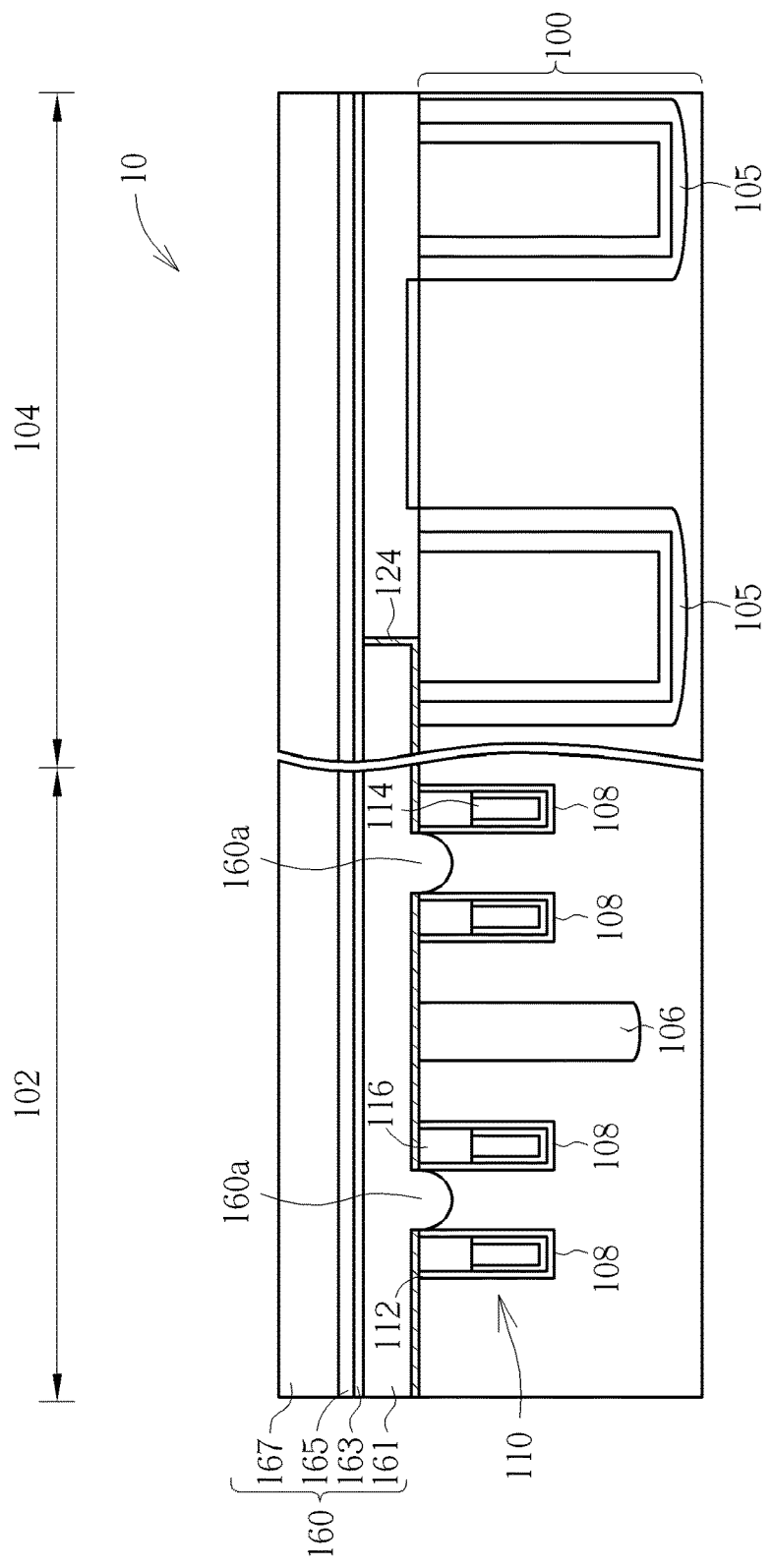

Referring to FIGS. 1-9, a method of forming a DRAM device according to a preferred embodiment of the present invention is shown, wherein FIG. 1 shows a top view of a DRAM device 10, FIG. 2 to FIG. 7 shows cross-sectional views of a DRAM device during the forming processes, and FIG. 8 and FIG. 9 show schematic cross-sectional views of a DRAM device take along the cross lines A-A' and B-B' in FIG. 1 respectively.

As shown in FIG. 1, a memory cell device such as a dynamic random access memory (DRAM) device 10 is provided in the present embodiment, and which includes at least one transistor (not shown in the drawings) and at least one capacitor (not shown in the drawings), thereto serve as the smallest unit in the DRAM array for accepting signals from word lines 110 and bit lines 160 during the operation. The DRAM device includes a substrate 100, such as a silicon substrate, silicon-containing substrate like SiC or SiGe substrate, or a silicon-on-insulator (SOI) substrate, and a memory cell region 102 and a periphery region 104 are defined on the substrate 100. For illustrated purpose, FIG. 1 only shows a top view of elements formed on the memory cell region 102, with elements formed on the periphery region 104 being omitted.

The substrate 100 includes a plurality of active areas (AAs) 101 formed thereon, the active areas 101 are parallelly extended along a first direction (not shown in the drawings). The substrate 100 further includes a plurality of buried gates 114, so as to function like a buried word line (BWL) 110 respectively. The buried gates 114 are parallel extended along a second direction (not shown in the drawings) to cross the active areas 101 along the first direction. Also, a plurality of bit lines 160 are formed on the substrate 100, extended along a third direction (not shown in the drawings) over the buried gates 114 to cross the active areas 101 and the word lines 110 at the same time, as shown in FIG. 1. In other words, the third direction is different from the first direction and the second direction, and the third direction is preferably perpendicular to the second direction and not perpendicular to the first direction. The bit lines 160 and the word lines 110 are electrically connected to a source/drain region (not shown in the drawings) of the transistor through at least one bit line contact 160a for example disposed below the bit lines 160, between the two word lines 110.

Figure 2:
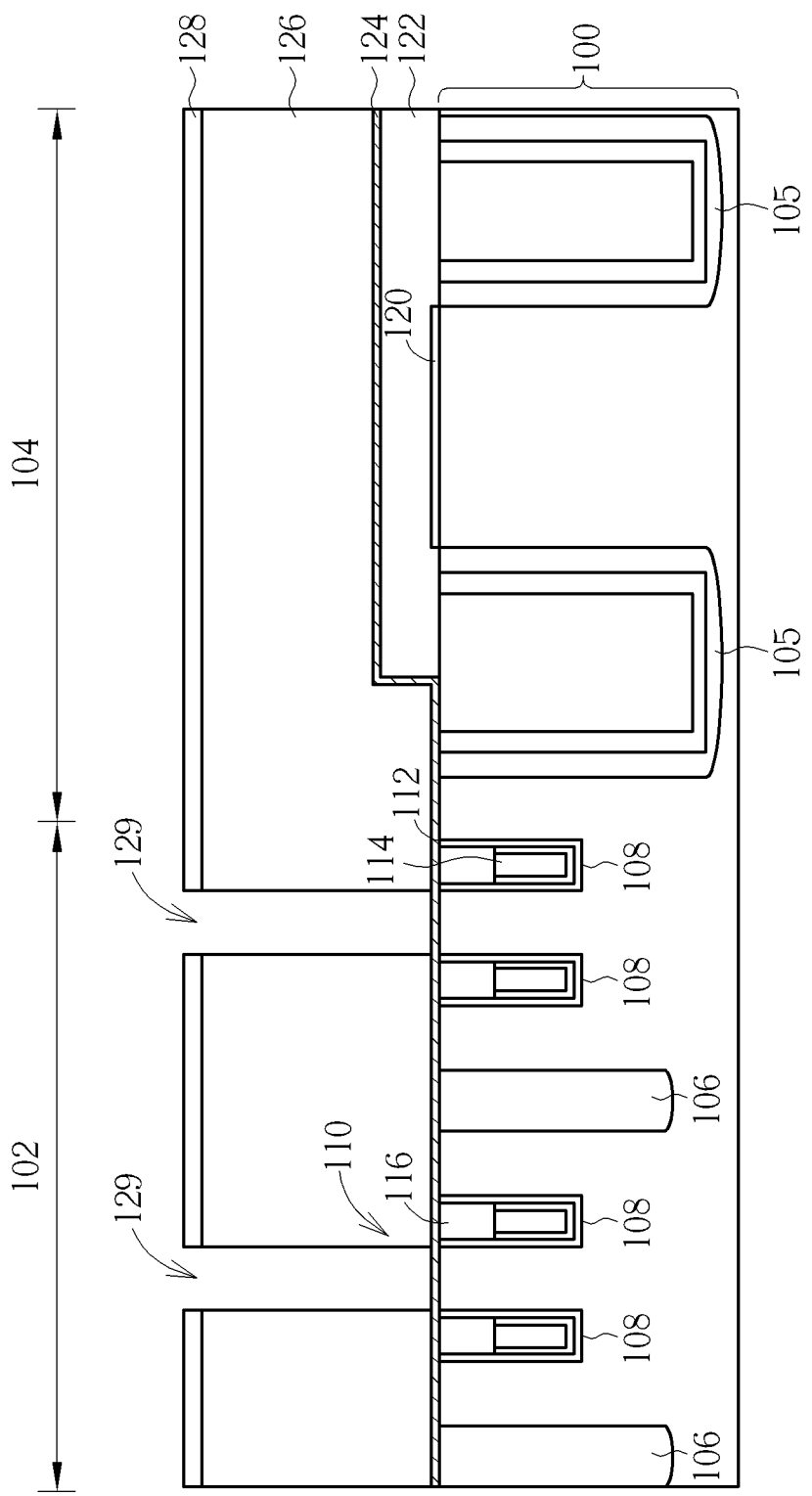

In one embodiment, the DRAM device 10 is but not limited to be formed through the following steps. Firstly, at least one shallow trench isolation (STI) is formed in the substrate 100, both within the memory cell region 102 and the periphery region 104. In the present embodiment, STIs 106, 105 with different depths are respectively formed in the memory cell region 102 and the periphery region 104, as shown in FIG. 2. The STI 106 formed in the memory cell region 102 may further define the active regions 101 on the substrate 100.

Next, a plurality of trenches 108 are formed in the substrate 100, parallel extending along the second direction within the memory cell region 102, followed by sequentially forming a dielectric layer 112 covering entire surfaces of each trench 108, a buried gate 114 filled in a bottom portion of each trench 108, and an insulating layer 116 filled in a top portion of each trench 108, in each trench 108. It is noted that, the insulating layer 116 has a top surface leveled with a top surface of the substrate 100, so that, the buried gates 114 formed in the substrate 100 may therefore function like the word lines 110 as shown in FIG. 1.

Then, a gate dielectric layer 120 and a semiconductor layer 122 such as a polysilicon layer are formed only within the periphery region 104, and an insulating layer 124 is formed both within the memory cell region 102 and the periphery region 104, to cover the gate dielectric layer 120 and the semiconductor layer 122. As shown in FIG. 2, the insulating layer 124 includes an oxide-nitride-oxide (ONO) structure, and which is directly in contact with the semiconductor layer 122 formed within the periphery region 104 and the substrate 100 and the word lines underneath within the memory cell region 102.

A sacrificial layer 126, such as an organic dielectric layer, and a patterned mask layer 128 are sequentially formed on the substrate 100. The patterned mask layer 128 includes at least one opening patterns (not shown in the drawings) for defining a trench. That is, openings 129 are formed in the sacrificial layer 126 to expose a portion of the insulating layer 127, while transferring the opening patterns into the sacrificial layer 126 underneath, as shown in FIG. 2.

Figure 3:
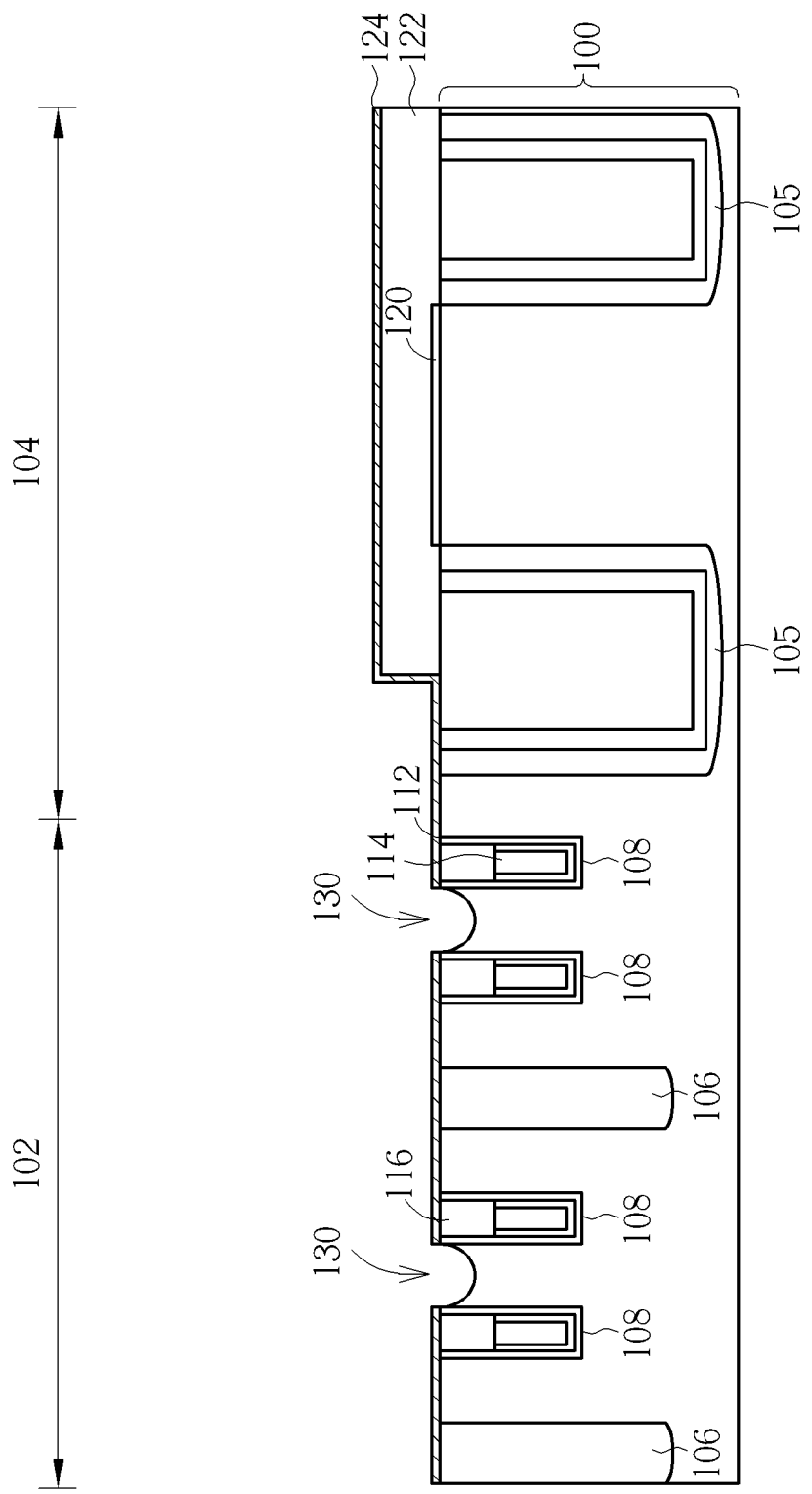

Following these, an etching process is performed, to remove the insulating layer 124 and a portion of the substrate 100 underneath through openings 129, so that, at least one trench 130 is formed in the substrate 100, within the memory cell region 102. The trench 130 is preferably formed between two word lines 110, to expose a portion of the substrate 100, as shown in FIG. 3. In one embodiment, an ion implantation process such as an anti-punch through implantation process is further performed through the exposed portion of the substrate 100, to form a doped region (not shown in the drawings) in the exposed portion of the substrate 100 for preventing possible current leakage.

Figure 4:
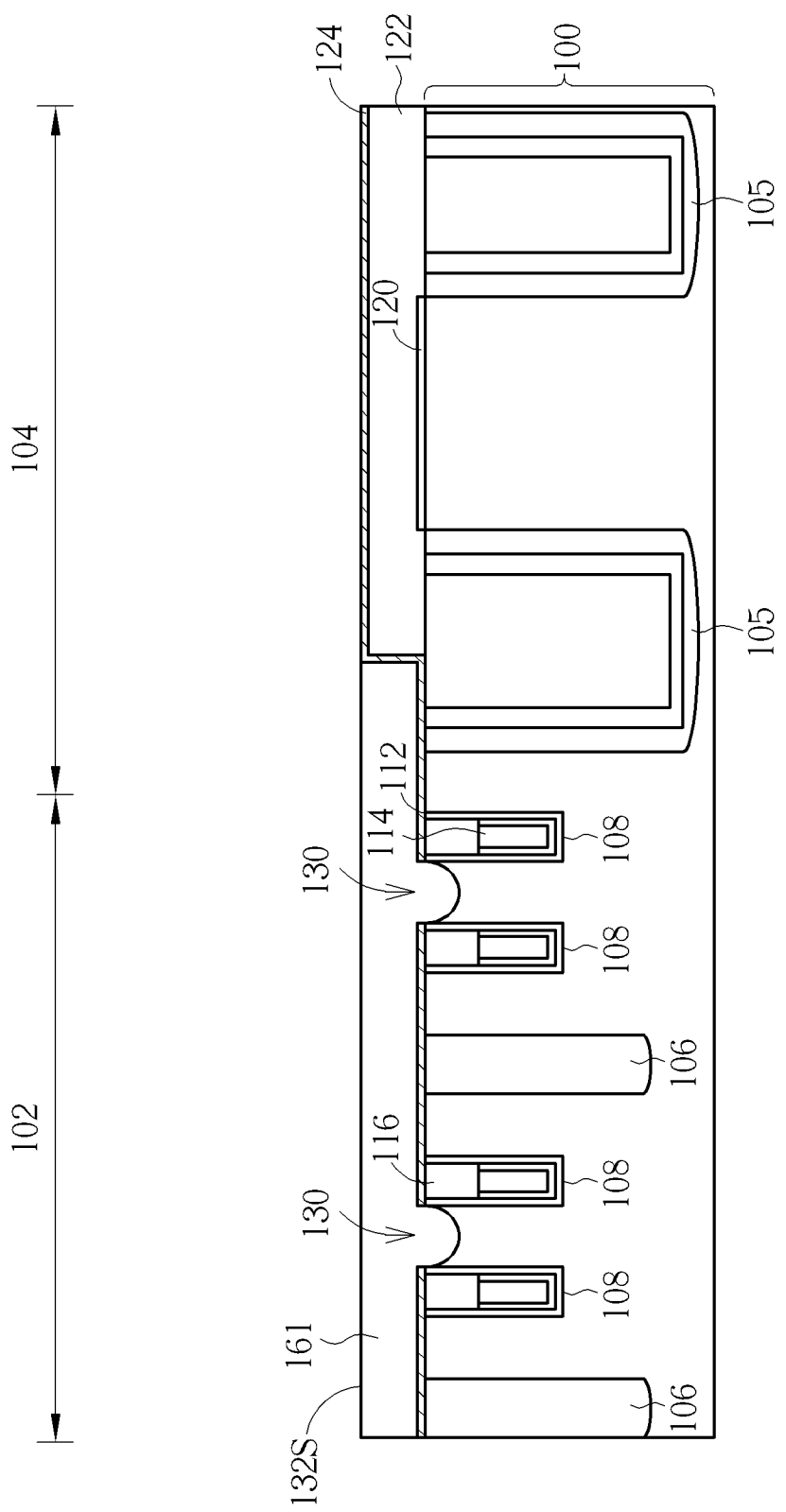
Figure 5:
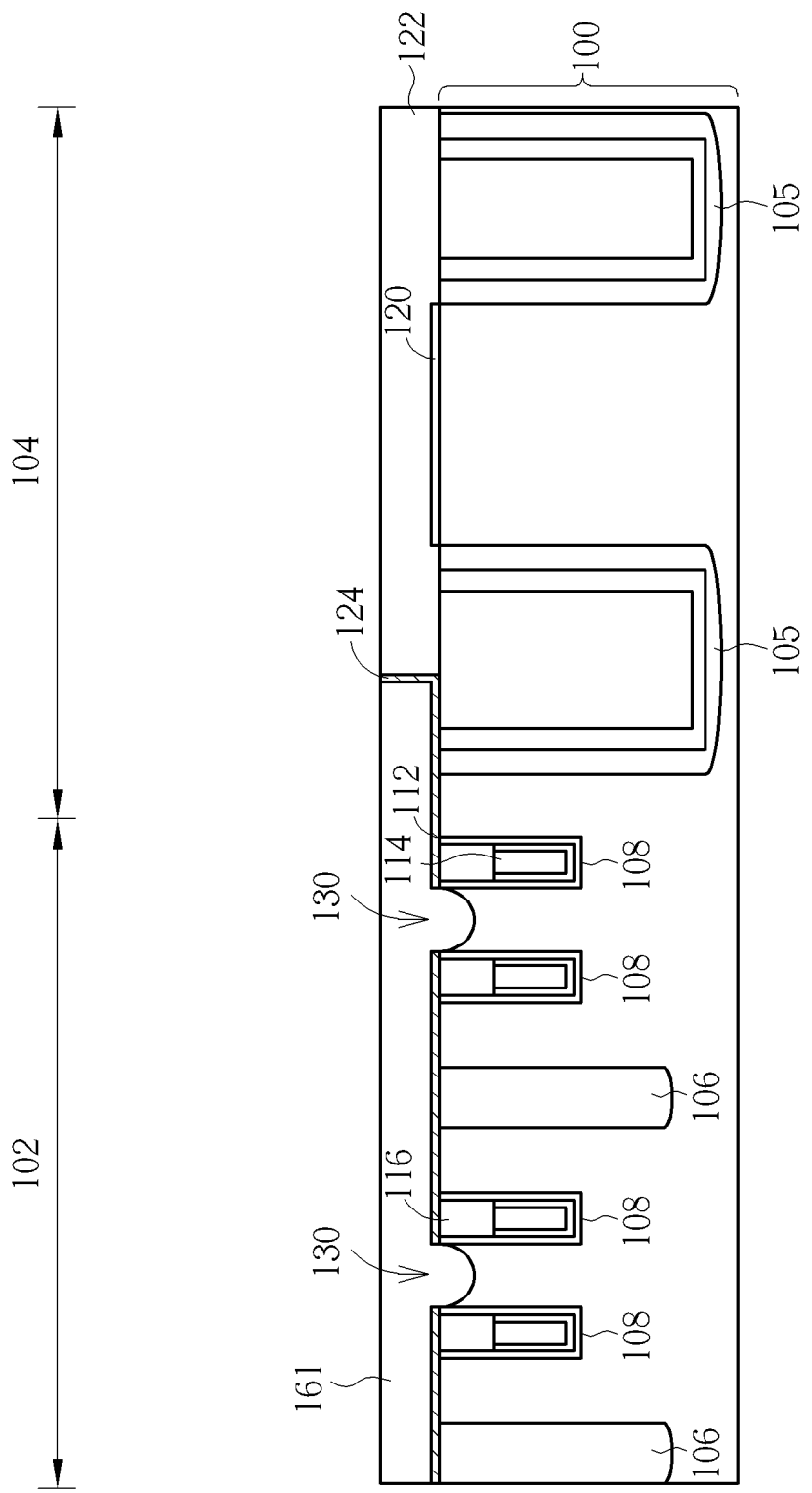

After completely removing the patterned mask layer 128 and the sacrificial layer 126, a semiconductor layer 161 such as a polysilicon layer is formed on the substrate 100, within the memory cell region 102. For example, a chemical vapor deposition (CVD) process is performed to entirely forming a semiconductor material layer (not shown in the drawings) on the substrate, followed by performing at least one planarization process, such as a chemical mechanical polishing (CMP) process, to partially remove the semiconductor material layer by using the insulating layer 124 over the semiconductor layer 122 as a stop layer. That is, a semiconductor layer 161 with a top surface leveled with the top surface of the insulating layer 124 is formed, as shown in FIG. 4. Next, another planarization process, such as a CMP process, is performed to partially remove the semiconductor layer 161 formed within the memory cell region 102, and to simultaneously remove the insulating layer 124 over the semiconductor layer 122. Accordingly, the semiconductor layer 122 formed within the periphery region 104 is therefore exposed, and the top surface of the semiconductor layer 161 formed within the memory cell region 102 and the top surface of the semiconductor layer 122 formed within the periphery region 104 are leveled with each other thereby, as shown in FIG. 5.

After that, a pre-cleaning process may be optionally performed, to remove residues generated from the aforementioned planarization processes. However, in other embodiment, the pre-cleaning process may also be omitted. Next, a barrier layer 163 is formed on the substrate, and the barrier layer 163 preferably includes a bilayer structure for example being consisted of a titanium (Ti) layer 163a and a titanium nitride (TiN) 163b, as shown in FIG. 6. In the present embodiment, a radio frequency physical vapor deposition (RF-PVD) process is preferably performed to sequential form the titanium layer 163a and the titanium nitride layer 163b on the substrate 100. Precisely speaking, the RF-PVD process is carried out in a physical vapor deposition chamber (not shown in the drawings), and which is performed by providing a target such as titanium at a top of the physical vapor deposition chamber and providing the substrate 100 at a bottom of the physical vapor deposition chamber, under a vacuum circumstance. During the performing, the RF source provided to the target is about 40 MHz to 50 MHz, the FR bias provided to the substrate 100 is about 20 MHz to 100 MHz, and a pressure for sputtering is elevated to about 100 mTorr to 150 mTorr. Then, the titanium layer 163a and the titanium nitride layer 163b are deposited respectively in about 6 A/s rate. Through this performance, the titanium 163a and the titanium nitride 163b may therefore obtain a thin thickness and an improved density. For example, a thickness of the titanium layer 163a is about 10 angstroms to 20 angstroms, a thickness of the titanium nitride layer 163b is about 20 angstroms to 30 angstroms, and a density thereof may be 4.7 g/cm$^3$ to 5.4 g/cm$^3$. In this way, the barrier layer 163 with an entire thickness of about 40 angstroms to 50 angstroms and a higher density is obtained through the RF-PVD process of the present invention.

As shown in FIG. 7, an interface layer 165 and a metal layer 167 are sequentially formed on the barrier layer 163. Precisely, the interface layer 165 for example includes a tungsten silicon (WSi) layer, and the metal layer 167 for example includes a low-resistant metal such as tungsten (W), aluminum (Al) or copper (Cu). In one embodiment, the interface layer 165 and the metal layer 167 are both formed through a physical vapor deposition (PVD) process, but not limited thereto.

Finally, a patterned mask layer (not shown in the drawings) is formed on the metal layer 167, to pattern the metal layer 167, the interface layer 165, the barrier layer 163 and the semiconductor layer 161 underneath, to form the bit lines 160 as shown in FIG. 1. In other words, the bit lines 160 are formed by patterned semiconductor layer 161, patterned barrier layer 163, patterned interface layer 165 and the patterned metal layer 167, and the semiconductor layer 161 filled in the trenches 130 may therefore form the bit line contacts (BLCs) 160a, as shown FIGS. 8 and 9. The bit lines contacts 160a are formed under the bit lines 160, and which are monolithic with the bit lines 160, so that, the bit lines 160 may further connects to a source/drain region (not shown in the drawings) of the transistor through the bit line contacts.

Also, the bit lines 160 and the word line 140 are isolated from each other by the insulating layer 124 formed on the substrate 100.

Through above steps, the method of forming a DRAM device 10 according to the preferred embodiment of the present invention is accomplished. In the present embodiment, the RF-PVD process is used to form the barrier layer 163 of the bit lines 160. The barrier layer 163 includes a bilayer structure for example including the titanium layer 163a and the titanium nitride layer 163b. Accordingly, the barrier layer 163 formed in the present embodiment may therefore obtain a thinner thickness and a higher density, in comparison with the barrier layers formed through other processes like atomic deposition process or other chemical vapor deposition processes. For example, the thickness of the titanium nitride layer 163b is about 20 angstroms to 30 angstroms, and the density of the titanium nitride layer 163b is about 4.7 g/cm$^3$ to 5.4 g/cm$^3$. Thus, the DRAM device 10 formed in the present embodiment is allowable to obtain the bit lines 160 with reduced resistance. On the other hand, although the barrier layer 163 includes the bilayer structure, the entire thickness thereof is only between 40 angstroms and 50 angstroms. That is, the DRAM device 10 obtained in the present embodiment is allowable to obtain the bit lines 160 with an improved height under a simplify process.

Overall speaking, the present invention provides a method of forming a DRAM device, by forming the barrier layer thereof via a RF-PVD process. Through this performance, the barrier layer is allowable to obtain a thinner thickness such as about 20-30 angstroms and a higher density such as 4.7-5.4 g/cm$^3$, so that, the barrier layer may therefore obtain a reduced resistance and an improved height under a simplify process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a dynamic random access memory (DRAM) device, comprising:
   forming a plurality of active areas on a substrate along a first direction;
   forming a plurality of buried gates in the substrate, the buried gates extending along a second direction across the first direction; and
   forming a plurality of bit lines over the buried gates, the bit lines extending along a third direction across the first direction and the second direction, each of the bit lines comprising a polysilicon layer, a barrier layer and a metal layer, wherein the barrier layer is formed through a radio frequency physical vapor deposition process.

2. The method of forming a DRAM device according to claim 1, wherein the barrier layer comprises a bilayer structure.

3. The method of forming a DRAM device according to claim 1, wherein the barrier layer comprises a titanium layer and a titanium nitride layer.

4. The method of forming a DRAM device according to claim 3, wherein a density of the titanium nitride layer is about 4.7 to 5.4 g/cm$^3$.

5. The method of forming a DRAM device according to claim 3, wherein a thickness of the titanium nitride layer is about 20 angstroms to 30 angstroms.

6. The method of forming a DRAM device according to claim 1, further comprising:
   performing a cleaning process before the barrier layer is formed.

7. The method of forming a DRAM device according to claim 1, wherein the polysilicon layer is formed through a chemical vapor deposition process.

8. The method of forming a DRAM device according to claim 1, wherein the metal layer is formed through a physical vapor deposition process.

9. The method of forming a DRAM device according to claim 1, further comprising:
   forming at least one plug below the bit lines, between the two buried gates, wherein the plug and the polysilicon layer are monolithic.

10. The method of forming a DRAM device according to claim 1, wherein the first direction is not perpendicular to the second direction and the third direction.

11. The method of forming a DRAM device according to claim 1, wherein the radio frequency physical vapor deposition process is performed at a high pressure.

12. The method of forming a DRAM device according to claim 11, wherein the radio frequency physical vapor deposition process is performed at a pressure ranged between 100 mTorr and 150 mTorr.

* * * * *